United States Patent
Kim et al.

(10) Patent No.: US 8,716,714 B2
(45) Date of Patent: May 6, 2014

(54) DISPLAY DEVICE HAVING ELECTROSTATIC DISCHARGE PROTECTION CIRCUIT AND MANUFACTURING METHOD THEREOF

(75) Inventors: Hyung-Soo Kim, Yongin (KR); In-Ho Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/481,714

(22) Filed: May 25, 2012

(65) Prior Publication Data
US 2013/0214277 A1     Aug. 22, 2013

(30) Foreign Application Priority Data
Feb. 17, 2012   (KR) ................ 10-2012-0016450

(51) Int. Cl.
| | |
|---|---|
| *H01L 29/04* | (2006.01) |
| *H01L 27/12* | (2006.01) |
| *H01L 29/49* | (2006.01) |
| *H01L 29/66* | (2006.01) |
| *H01L 29/786* | (2006.01) |
| *G02F 1/1362* | (2006.01) |

(52) U.S. Cl.
CPC ............ *H01L 27/12* (2013.01); *H01L 27/1214* (2013.01); *H01L 29/4908* (2013.01); *H01L 29/66765* (2013.01); *H01L 29/78621* (2013.01); *H01L 29/66757* (2013.01); *G02F 1/136227* (2013.01)
USPC ................ 257/59; 257/72; 438/149; 438/151

(58) Field of Classification Search
CPC . H01L 27/1214; H01L 27/12; H01L 29/4908; H01L 29/66765; H01L 29/78621; H01L 29/66757; G02F 1/136227
USPC .............................. 257/59, 72; 438/149, 151
See application file for complete search history.

(56) References Cited

U.S. PATENT DOCUMENTS

| | | | |
|---|---|---|---|
| 2007/0262317 A1* | 11/2007 | Oh ................................. | 257/72 |
| 2008/0062112 A1* | 3/2008 | Umezaki ....................... | 345/100 |
| 2010/0291760 A1* | 11/2010 | Doudoumopoulos et al. .............................. | 438/487 |
| 2011/0163842 A1* | 7/2011 | Feichtinger et al. ........... | 338/20 |

FOREIGN PATENT DOCUMENTS

| | | |
|---|---|---|
| KR | 10-2007-0109589 | 11/2007 |
| KR | 10-2010-0074935 | 7/2010 |
| WO | WO 2010007102 A1 * | 1/2010 |

* cited by examiner

*Primary Examiner* — Anthony Ho
(74) *Attorney, Agent, or Firm* — Christie, Parker & Hale, LLP

(57) ABSTRACT

A method of manufacturing a display device including an electrostatic discharge protection circuit, the method including: forming an amorphous silicon layer on a substrate; crystallizing a partial region of the amorphous silicon layer into a polycrystalline silicon layer; and forming at least one transistor on the amorphous silicon layer that was not crystallized into the polycrystalline layer, wherein the electrostatic discharge protection circuit comprises the at least one transistor.

12 Claims, 5 Drawing Sheets

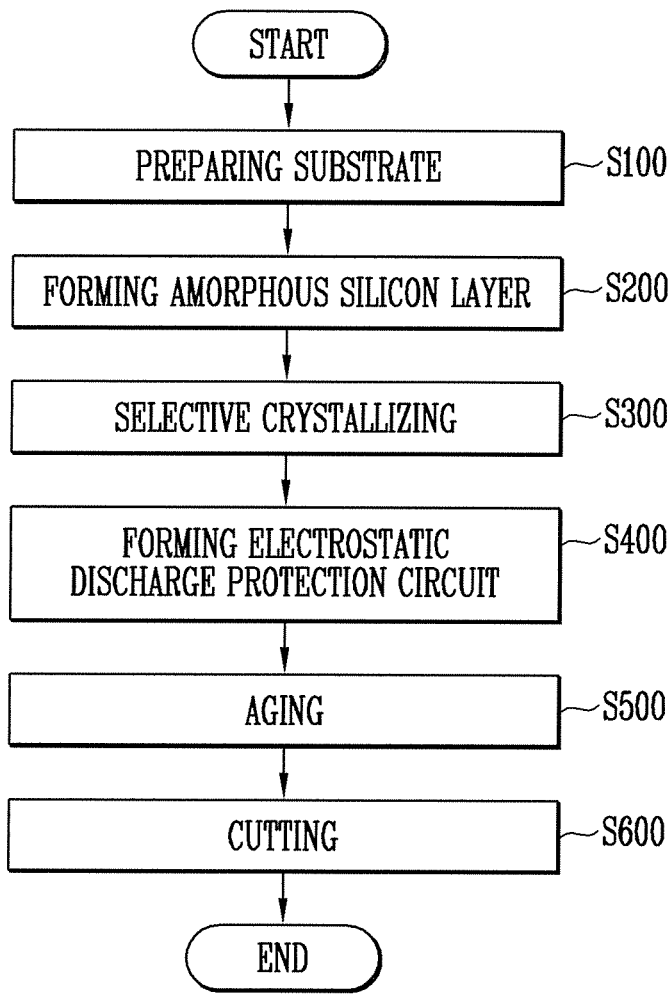
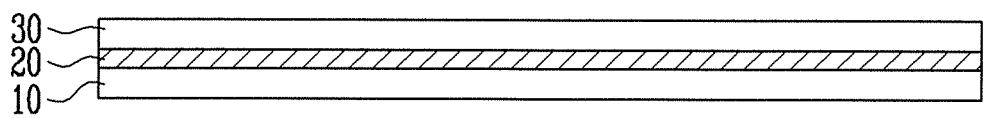

DISPLAY DEVICE HAVING ELECTROSTATIC DISCHARGE PROTECTION CIRCUIT AND MANUFACTURING METHOD THEREOF

CROSS-REFERENCE TO RELATED APPLICATION

This application claims priority to and the benefit of Korean Patent Application No. 10-2012-0016450, filed on Feb. 17, 2012, in the Korean Intellectual Property Office, the entire content of which is incorporated herein by reference.

BACKGROUND

1. Field

Aspects of embodiments of the present invention relate to a display device having a static electricity discharge protection circuit and a manufacturing method thereof, and more particularly, to a display device having an electrostatic discharge protection circuit and an amorphous silicon region, and a manufacturing method thereof.

2. Description of the Related Art

Various display devices capable of reducing weight and volume, which are disadvantages of a cathode ray tube, have been developed, for example, a liquid crystal display (LCD), an organic light emitting display (OLED), and/or the like.

Because high definition displays may be desired, these display devices may include a polycrystalline silicon thin film transistors (poly-Si TFTs) having a rapid operation speed as a switching elements and a driving elements.

Polycrystalline silicon may be generated by forming amorphous silicon on a substrate and crystallizing the amorphous silicon. Various methods for crystallizing the amorphous silicon may be used, including, for example, an excimer laser annealing (ELA) method. In the ELA method, the amorphous silicon is irradiated with laser to thereby be crystallized into polycrystalline silicon.

In the related art, a scheme of crystallizing an entire region of the amorphous silicon layer formed on the substrate without division has been used. However, a scheme of selectively crystallizing only a region of the amorphous silicon layer, in which polycrystalline silicon may actually be used in order to increase productivity, may also be used.

Accordingly, when both the amorphous silicon region and the polycrystalline silicon region are present on the substrate, it may be beneficial to efficiently utilize the amorphous silicon region.

SUMMARY

An aspect of embodiments of the present invention provides for a display device including an electrostatic discharge protection circuit capable of increasing (or improving) productivity and utilization of an amorphous silicon region by disposing the electrostatic discharge protection circuit at an amorphous silicon region rather than a polycrystalline silicon region, and a manufacturing method thereof.

According to an exemplary embodiment of the present invention, there is provided a method of manufacturing a display device including an electrostatic discharge protection circuit, the method including: forming an amorphous silicon layer on a substrate; crystallizing a partial region of the amorphous silicon layer into a polycrystalline silicon layer; and forming at least one transistor on the amorphous silicon layer that was not crystallized into the polycrystalline layer, wherein the electrostatic discharge protection circuit includes the at least one transistor.

In one embodiment, the method may further include supplying a bias voltage to a voltage supply wiring electrically coupled to a gate electrode of the at least one transistor to increase the threshold voltage of the at least one transistor.

In one embodiment, the method may further include cutting away a part of the substrate in which the voltage supply wiring is disposed.

In one embodiment, when forming the at least one transistor, at least a portion of the amorphous silicon layer may include a semiconductor layer of the at least one transistor.

In one embodiment, the at least one transistor may be formed such that it is diode-connected.

In one embodiment, the at least one transistor may be formed such that it includes a P-channel metal oxide semiconductor (PMOS) transistor or an N-channel metal oxide semiconductor (NMOS) transistor.

In one embodiment, forming the amorphous silicon layer on the substrate may include, forming a buffer layer on the substrate and then forming the amorphous silicon layer on the buffer layer.

According to another exemplary embodiment of the present invention, there is provided a display device, including: a substrate; a silicon layer formed on the substrate, the silicon layer having an amorphous silicon region and a polycrystalline silicon region; and an electrostatic discharge protection circuit including at least one transistor formed at the amorphous silicon region.

In one embodiment, a semiconductor layer of the at least one transistor may include at least a portion of the amorphous silicon region.

In one embodiment, the at least one transistor may be diode-connected.

In one embodiment, the at least one transistor may include a P-channel metal oxide semiconductor (PMOS) transistor or an N-channel metal oxide semiconductor (NMOS) transistor.

In one embodiment, the display device may further include a buffer layer interposed between the substrate and the silicon layer.

In one embodiment, the at least one transistor may be electrically coupled to at least one pad, and the at least one pad may be at the polycrystalline silicon region.

BRIEF DESCRIPTION OF THE DRAWINGS

The accompanying drawings, together with the specification, illustrate exemplary embodiments of the present invention, and, together with the description, serve to explain principles of the present invention.

FIG. 1 is a flow chart showing a manufacturing method of a display device including an electrostatic discharge protection circuit according to an exemplary embodiment of the present invention.

FIG. 2 is a cross-sectional view showing a substrate preparing operation and an amorphous silicon layer forming operation according to an exemplary embodiment of the present invention

DETAILED DESCRIPTION

Figure 3:
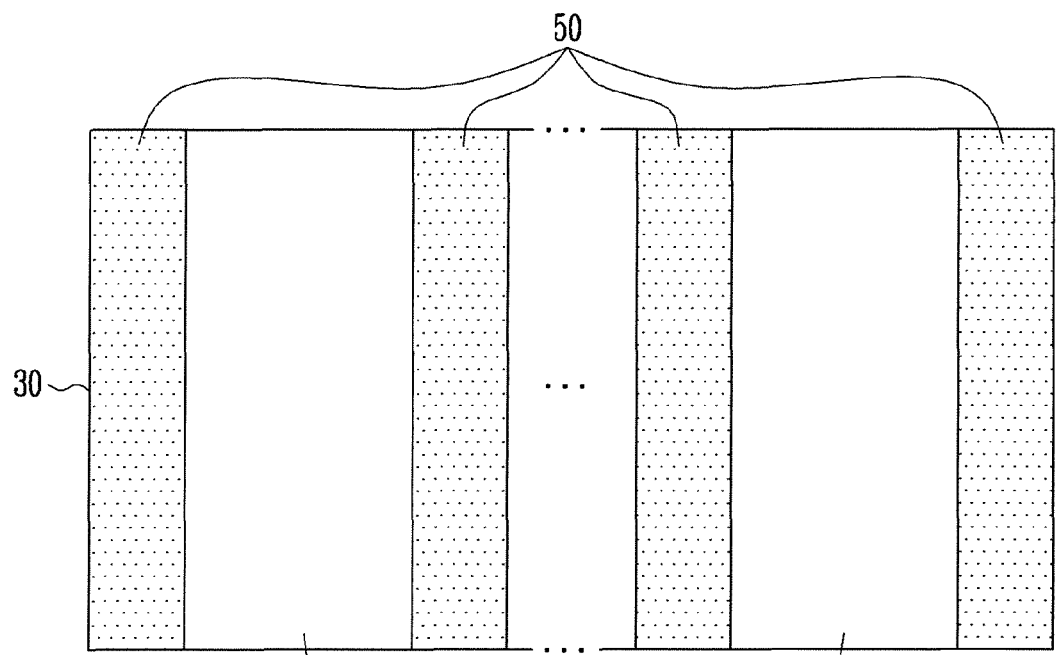
FIG. 3 is a plan view showing a selective crystallizing operation according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it may be directly on the another element or be indirectly on the another element with one or more intervening elements interposed therebetween. Also, when an element is referred to as being "coupled to" another element, it may be directly coupled to the another element or be indirectly coupled to the another element with one or more intervening elements interposed therebetween. Hereinafter, like reference numerals refer to like elements.

Specific matters of other exemplary embodiments will be included in a detailed description and the accompanying drawings.

Further, in the accompanying drawings, portions not absolutely necessary for one of ordinary skill in the art to understand embodiments of the present invention may be omitted in order to provide a clear description of the present invention.

Hereafter, a display device including an electrostatic discharge protection circuit and a manufacturing method thereof according to exemplary embodiments of the present invention will be described with reference to the accompanying drawings.

FIG. 1 is a flow chart showing a manufacturing method of a display device including an electrostatic discharge protection circuit according to an exemplary embodiment of the present invention.

Referring to FIG. 1, the manufacturing method of a display device including an electrostatic discharge protection circuit according to an exemplary embodiment of the present invention may include: a substrate preparing operation (S100); an amorphous silicon layer forming operation (S200); a selective crystallizing operation (S300); and an electrostatic discharge protection circuit forming operation (S400). In one embodiment, the method may further include an aging operation (S500) and/or a cutting operation (S600).

FIG. 2 is a cross-sectional view showing a substrate preparing operation and an amorphous silicon layer forming operation according to an exemplary embodiment of the present invention.

Referring to FIG. 2, at the substrate preparing operation (S100), a substrate 10, on which pixels of a display device, an electrostatic discharge protection circuit, and/or the like may be disposed, is prepared.

The substrate 10 may be made of an insulating material, for example, glass, plastic, silicon, or synthetic resin, and may be a transparent substrate such as a glass substrate.

At the amorphous silicon layer forming operation (S200), an amorphous silicon layer 30 is formed on the substrate 10.

In an exemplary embodiment of the present invention, at the amorphous silicon layer forming operation (S200), the amorphous silicon layer 30 may be formed on a buffer layer 20 after the buffer layer 20 is formed on the substrate 10.

The buffer layer 20 may prevent impurities contained in the substrate 10 from being diffused (e.g., diffused into adjacent layers), and may be formed of an insulating film such as a silicon oxide film ($SiO_2$) or a silicon nitride film ($SiN_x$).

The buffer layer 20 and the amorphous silicon layer 30 may be formed (e.g., disposed or stacked) on the substrate 10 by, for example, a chemical vapor deposition method, a physical vapor deposition method, and/or the like.

FIG. 3 is a plan view showing a selective crystallizing operation according to an exemplary embodiment of the present invention.

In an embodiment of the present invention, at the selective crystallizing operation (S300), a partial region of the amorphous silicon layer 30 disposed over the substrate 10 is crystallized into polycrystalline silicon.

Productivity may be increased by not performing a crystallizing process on an entire region of the amorphous silicon layer 30. For example, productivity may be increased by not performing a crystallizing process at a region of the amorphous silicon layer 30 that may not require polycrystalline silicon and selectively performing the crystallizing process at another region of the amorphous silicon layer 30 that may require polycrystalline silicon. A region that may require the polycrystalline silicon may be, for example, a pixel region requiring a transistor operated at a high speed. A region that may not require polycrystalline silicon (e.g., where the crystallizing process may not be performed) may be at a region where, for example, a low speed transistor may be satisfactorily used.

Therefore, according to an exemplary embodiment of the present invention, as shown in FIG. 3, a part of the amorphous silicon layer 30 is crystallized into polycrystalline silicon, and is thus present as the polycrystalline silicon region (or regions) 50. Accordingly, a remaining part that is not crystallized into polycrystalline silicon is present as the amorphous silicon region (or regions) 60.

An excimer laser annealing (ELA) method of irradiating with the excimer laser, which is a high-output pulse laser, may be used in order to crystallize the part of amorphous silicon into polycrystalline silicon. However, other crystallizing methods may also be used.

Figure 4:
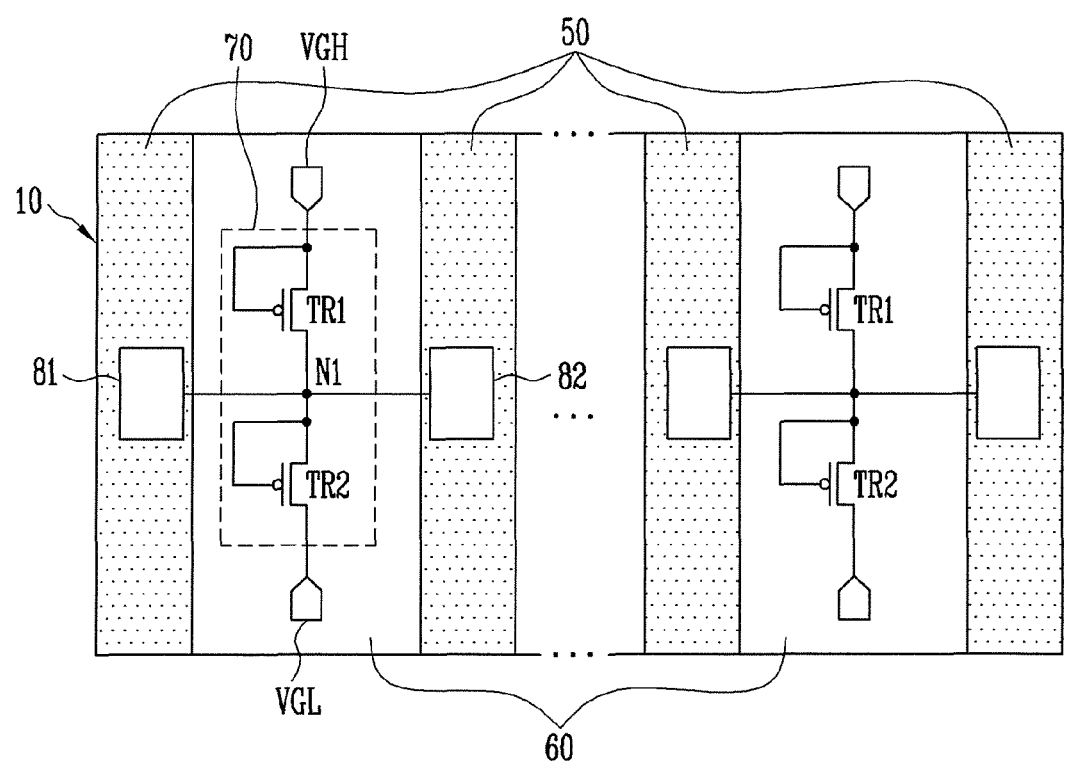
FIGS. 4 and 5 are schematic plan views showing electrostatic discharge protection circuit forming operations according to exemplary embodiments of the present invention.
Figure 5:
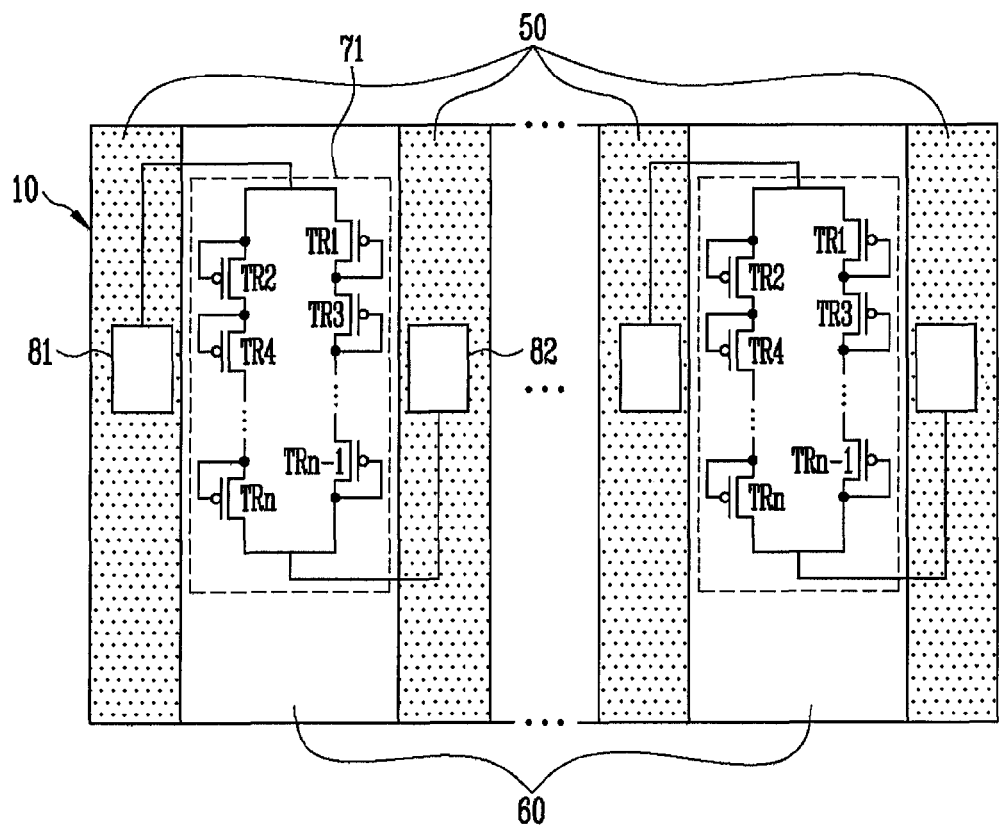

FIGS. 4 and 5 are schematic plan views showing electrostatic discharge protection circuit forming operations according to exemplary embodiments of the present invention. The electrostatic discharge protection circuits according to various embodiments of the present invention may have different forms, for example, forms as shown in FIGS. 4 and 5.

Referring to FIG. 4, during the electrostatic discharge protection circuit forming operation (S400), an electrostatic discharge production circuit 70 may be formed at (e.g., on or in) the amorphous silicon region 60, which has not been subjected to the crystallizing process in the selective crystallizing operation (S300).

The electrostatic discharge protection circuit 70 may include at least one transistor, and may be coupled to a first pad 81 and a second pad 82, for an example, to disperse static electricity introduced into the pads 81 and 82. The electrostatic discharge protection circuit 70 may operate such that a defect (e.g., a defect due to static electricity) of a product (e.g., the display device) may be minimized or reduced.

The at least one transistor included in the electrostatic discharge protection circuit 70 may be formed at (e.g., on or in) the amorphous silicon region 60 rather than the polycrystalline silicon region 50. Accordingly, the amorphous silicon region 60 present at the selective crystallizing operation (S300), which may be performed in order to increase productivity, may be used (e.g., efficiently used). Therefore, the area of the polycrystalline silicon region 50 may be reduced (e.g., reduced relative to a display device without the electrostatic discharge protection circuit formed in at least part of an amorphous silicon region), thereby making it possible to further increase productivity (e.g., a yield).

In addition, because the at least one transistor included in at least a portion of the electrostatic discharge protection circuit 70 may not require high speed operation, the at least one transistor may appropriately or adequately perform an electrostatic discharge protection function even if amorphous silicon, rather than polycrystalline silicon, is included in at least a portion of a semiconductor layer of the at least one transistor (e.g., a semiconductor layer on which a channel is formed).

Figure 6:
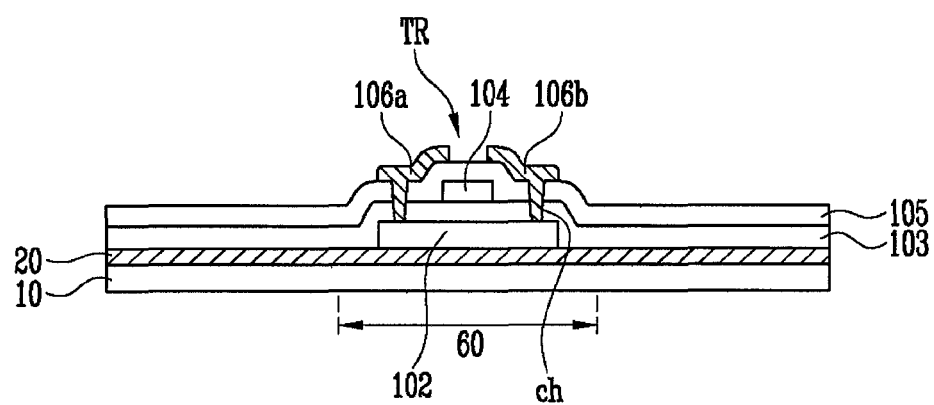
FIG. 6 is a cross-sectional view showing a transistor included in an amorphous silicon region according to an exemplary embodiment of the present invention.

FIG. 6 is a cross-sectional view showing a transistor provided in an amorphous silicon region according to an exemplary embodiment of the present invention. A single transistor (TR) at (e.g., mounted in or on) the amorphous silicon region 60 is representatively shown in FIG. 6, by way of example.

Referring to FIG. 6, the transistor (TR) formed at the amorphous silicon region 60 may include a semiconductor layer 102, a gate insulating film 103, a gate electrode 104, an interlayer insulating film 105, and source/drain electrodes 106a and 106b.

The semiconductor layer 102 may be formed on a buffer layer 20 so as to have a pattern (e.g., a suitable or predetermined pattern) and may be made of the amorphous silicon present in the amorphous silicon region 60.

The amorphous silicon region 60 may be etched with a plurality of patterns in order to form a plurality of semiconductor layers 102.

The gate insulating film 103 may be formed on the semiconductor layer 102. The gate insulating film 103 may be formed of any one of a nitride film or an oxide film, for example, a silicon oxide film or a silicon nitride film, but is not limited thereto.

The gate electrode 104 may be formed on the gate insulating film 103 so as to have a pattern (e.g., a suitable or predetermined pattern). The interlayer insulating film 105 may be formed on the gate electrode 104.

The gate insulating film 103 may insulate between the semiconductor layer 102 and the gate electrode 104, and the interlayer insulating film 105 may insulate between the gate electrode 104 and the source/drain electrodes 106a and 106b.

The source/drain electrodes 106a and 106b may be formed on the interlayer insulating film 105. The source/drain electrodes 106a and 106b may be coupled (e.g., electrically coupled or electrically connected) to both sides of the semiconductor layer 102 through a contact hole (ch) formed on the gate insulating film 103 and the interlayer insulating film 105, respectively.

The gate electrode 104 and the source/drain electrodes 106a and 106b may be made of a metal such as molybdenum (Mo), tungsten (W), titanium (Ti), aluminum (Al), and/or the like, and/or an alloy or a stack structure thereof, but is not limited thereto.

The at least one transistor included in at least a part of the electrostatic discharge protection circuit 70 may be diode-connected. That is, the gate and the drain electrodes of the diode-connected transistor are connected to each other, thereby making it possible to maintain a direction of current, for example, like a diode.

Further, the at least one transistor included in the electrostatic discharge protection circuit 70 may be a PMOS transistor or an NMOS transistor.

The electrostatic discharge protection circuit 70 as shown in FIG. 4 is an example of a configuration with two transistors TR1 and TR2.

A first transistor TR1 may be coupled between a high power supply VGH and a first node N1, and a second transistor TR2 may be coupled between a low power supply VGL and the first node N1.

In both of the first transistor TR1 and the second transistor TR2, the source electrodes and the gate electrodes may be coupled to each other.

More specifically, in the first transistor TR1, the source electrode may be coupled to the first node N1, and the gate electrode and the drain electrode may be coupled to the high power supply VGH.

In addition, in the second transistor TR2, the gate electrode and the drain electrode may be coupled to the first node N1, and the source electrode may be coupled to the low power supply VGL.

The high power supply VGH may have a relatively high voltage as compared with the low power supply VGL.

The first node N1 may be where the source electrode of the first transistor TR1, the gate electrode and drain electrode of the second transistor TR2, the first pad 81, and the second pad 82 are each coupled (e.g., electrically coupled or connected) to one another.

In an embodiment of the present invention, when a high voltage having a positive (+) charge is generated due to static electricity, a path of current may be formed from the first node N1 to the high power supply VGH, and when a high voltage having a negative (−) charge is generated due to static electricity, the path of the current may be formed from the first node N1 to the low power supply VGL, thereby preventing (or suppressing or reducing) a damage due to static electricity.

As another example, as shown in FIG. 5, an electrostatic discharge protection circuit 71 may be configured of n transistors TR1 to TRn. Here, n may be set to a natural number greater than 2.

In an embodiment of the present invention, in each of the transistors TR1 to TRn, the gate electrode and the drain electrode are coupled to each other.

Odd numbered transistors TR1, TR3 . . . TRn−1 may be coupled in series with one another and may be coupled between the first pad 81 and the second pad 82, as shown in FIG. 5.

In addition, the odd numbered transistors TR1, TR3 . . . TRn−1 may form a path for a current flowing from the first pad 81 to the second pad 82.

Even numbered transistors TR2, TR4 . . . TRn may also be coupled in series with one another and may be coupled between the first pad 81 and the second pad 82, as shown in FIG. 5.

In addition, the even numbered transistors (TR2, TR4 . . . TRn) may form a path for a current flowing from the second pad 82 to the first pad 81.

The odd numbered transistors (TR1, TR3 . . . TRn−1) and the even numbered transistors (TR2, TR4 . . . TRn) may be coupled in parallel with one another between the first pads 81 and second pads 82.

In an embodiment of the present invention, when the static electricity having high voltage is introduced into the first pad 81, the path of the current to the second pad 82 may include the odd numbered transistors (TR1, TR3 . . . TRn−1), and the voltage of the static electricity is reduced while passing through the odd numbered transistors (TR1, TR3 . . . TRn−1), thereby making it possible to prevent (or reduce or suppress) a damage due to static electricity.

In an embodiment of the present invention, when the static electricity having high voltage is introduced into the second pad 82, the path of the current to the first pad 81 may include the even numbered transistors (TR2, TR4 . . . TRn), and the voltage of the static electricity is reduced while passing through the even numbered transistors (TR2, TR4 . . . TRn), thereby making it possible to prevent (or reduce or suppress) a damage due to static electricity.

The number of transistors (TR1 to TRn) included in the electrostatic discharge protection circuit 71 may be variously changed.

The electrostatic discharge protection circuits 70 and 71 described with reference with FIGS. 4 and 5 may correspond to any one of various embodiments of the present invention, or another electrostatic discharge protection circuit having a configuration different from the configurations described with reference to FIGS. 4 and 5 may also be used.

Figure 7:
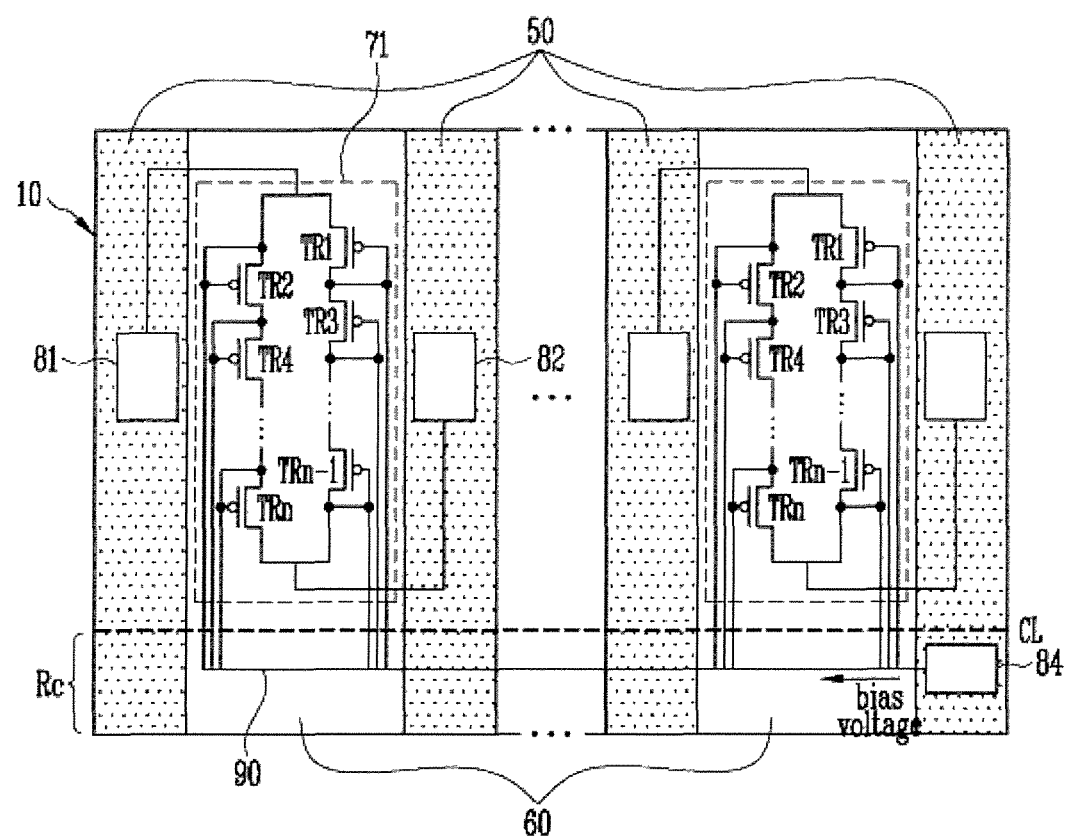
FIG. 7 is a schematic plan view showing an aging operation according to an exemplary embodiment of the present invention.

FIG. 7 is a schematic plan view showing an aging operation according to an exemplary embodiment of the present invention. Particularly, FIG. 7 shows at least a portion of an aging operation (S500) described in connection with the embodiment shown in FIG. 5.

Referring to FIG. 7, at the aging operation (S500), a bias voltage may be supplied to the gate electrodes of the transistors (TR1 to TRn) included in the electrostatic discharge protection circuit 71 via a voltage supply wiring 90 for a suitable time (e.g., a predetermined time).

An absolute value of a threshold voltage of the transistors (TR1 to TRn) included in the electrostatic discharge protection circuit 71 may be increased by the aging operation.

The voltage supply wiring 90, which is coupled to the gate electrodes of each transistor (TR1 to TRn) of the electrostatic discharge protection circuit 70, may transfer the bias voltage supplied from a voltage supplier (not shown) to each transistor (TR1 to TRn).

The voltage supply wiring 90 may be coupled (e.g., electrically coupled) to an external voltage supply through a pad 84.

When the bias voltage is supplied to the gate electrodes of the transistors for the suitable time (e.g., the predetermined time), the threshold voltages of the transistors may be changed (e.g., a shift phenomenon of the threshold voltage may occur).

A change amount of the threshold voltage is changed according to a size and a supply time of the bias voltage, which may be continuously supplied as a DC voltage (e.g., a suitable or predetermined DC voltage) or as a pulsed voltage.

The threshold voltage of each transistor (TR1 to TRn) included in the electrostatic discharge protection circuit 71 may be increased through the aging operation (S500), thereby making it possible to implement an electrostatic discharge protection effect with fewer transistors as compared to the case where the transistors have not been through an aging operation.

The above-mentioned aging operation (S500) may also be applied to the electrostatic discharge protection circuit 70 shown in FIG. 4 or other electrostatic discharge protection circuits having other configurations.

Figure 8:
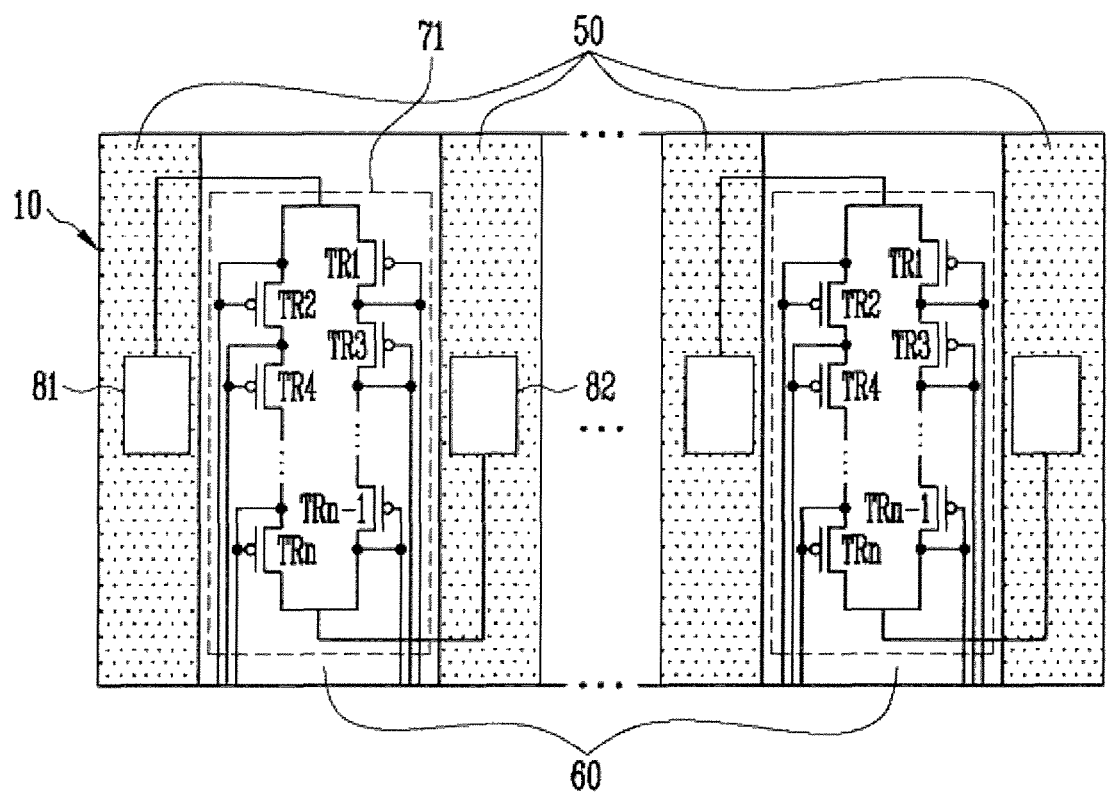
FIG. 8 is a schematic plan view showing a cutting operation according to an exemplary embodiment of the present invention.

FIGS. 7 and 8 together show a cutting operation according to an exemplary embodiment of the present invention.

Referring to FIGS. 7 and 8, during the cutting operation (S600), a part of the substrate 10, on which the voltage supply wiring 90 is disposed, is cut (e.g., cut away from the substrate 10).

For example, the substrate 10 may be cut along a cutting line (CL), such that a substrate region Rc, which becomes unnecessary after the aging operation (S500), may be removed. Therefore, a dead space of the substrate 10 may be reduced.

Aspects of exemplary embodiments of the present invention provide for, a display device having an electrostatic discharge protection circuit capable of increasing productivity and utilization of an amorphous silicon region by disposing an electrostatic discharge protection circuit at the amorphous silicon region rather than a polycrystalline silicon region, and a manufacturing method thereof.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing a display device comprising an electrostatic discharge protection circuit, the method comprising:
    forming an amorphous silicon layer on a substrate;
    crystallizing a partial region of the amorphous silicon layer into a polycrystalline silicon layer; and
    forming at least one transistor on the amorphous silicon layer that was not crystallized into the polycrystalline layer, wherein the electrostatic discharge protection circuit comprises the at least one transistor.

2. The method according to claim 1, further comprising supplying a bias voltage to a voltage supply wiring electrically coupled to a gate electrode of the at least one transistor to increase the threshold voltage of the at least one transistor.

3. The method according to claim 2, further comprising cutting away a part of the substrate on which the voltage supply wiring is disposed.

4. The method according to claim 1, wherein when forming the at least one transistor, at least a portion of the amorphous silicon layer comprises a semiconductor layer of the at least one transistor.

5. The method according to claim 1, wherein the at least one transistor is formed such that it is diode-connected.

6. The method according to claim 1, wherein the at least one transistor is formed such that it comprises a P-channel metal oxide semiconductor (PMOS) transistor or an N-channel metal oxide semiconductor (NMOS) transistor.

7. The method according to claim 1, wherein forming the amorphous silicon layer on the substrate comprises forming a buffer layer on the substrate and then forming the amorphous silicon layer on the buffer layer.

8. A display device, comprising:
    a substrate;
    a silicon layer formed on the substrate, the silicon layer comprising an amorphous silicon region and a polycrystalline silicon region; and
    an electrostatic discharge protection circuit comprising at least one transistor formed at the amorphous silicon region,
    wherein a semiconductor layer of the at least one transistor comprises at least a portion of the amorphous silicon region.

9. The display device according to claim 8, wherein the at least one transistor is diode-connected.

10. The display device according to claim 8, wherein the at least one transistor comprises a PMOS transistor or an NMOS transistor.

11. The display device according to claim 8, further comprising a buffer layer interposed between the substrate and the silicon layer.

12. The display device according to claim 8, wherein the at least one transistor is electrically coupled to at least one pad, the at least one pad being at the polycrystalline silicon region.

* * * * *